(12) United States Patent
Lin et al.

(10) Patent No.: US 11,719,252 B2
(45) Date of Patent: Aug. 8, 2023

(54) FAN

(71) Applicant: Acer Incorporated, New Taipei (TW)

(72) Inventors: Yu-Ming Lin, New Taipei (TW);
Wen-Neng Liao, New Taipei (TW);
Cheng-Wen Hsieh, New Taipei (TW);
Chun-Chieh Wang, New Taipei (TW);
Han-Liang Huang, New Taipei (TW);
Sheng-Yan Chen, New Taipei (TW);
Tsung-Ting Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 17/688,910

(22) Filed: Mar. 8, 2022

(65) Prior Publication Data

US 2022/0290684 A1    Sep. 15, 2022

(30) Foreign Application Priority Data

Mar. 12, 2021    (TW) .................................. 110108972

(51) Int. Cl.
*F04D 29/28* (2006.01)
*H05K 7/20* (2006.01)
*F04D 29/30* (2006.01)

(52) U.S. Cl.
CPC ......... *F04D 29/281* (2013.01); *F04D 29/305* (2013.01); *H05K 7/20172* (2013.01)

(58) Field of Classification Search
CPC ...... F04D 29/281; F04D 17/16; F04D 29/282; F04D 29/30; F04D 29/384
See application file for complete search history.

(56) References Cited

U.S. PATENT DOCUMENTS

| | | | | |
|---|---|---|---|---|
| 10,001,128 | B2 * | 6/2018 | Lin | F04D 29/023 |
| 10,808,715 | B2 | 10/2020 | Yu et al. | |
| 2007/0065279 | A1 * | 3/2007 | Lin | F04D 29/281 |
| | | | | 415/206 |
| 2014/0079541 | A1 * | 3/2014 | Chiou | F04D 25/0613 |
| | | | | 415/206 |
| 2014/0219789 | A1 * | 8/2014 | Horng | F04D 29/162 |
| | | | | 415/206 |
| 2018/0202456 | A1 * | 7/2018 | Tamaoka | F04D 25/0606 |
| 2019/0072112 | A1 * | 3/2019 | Lin | F04D 29/666 |
| 2019/0128279 | A1 * | 5/2019 | Yu | G06F 1/203 |
| 2019/0162201 | A1 * | 5/2019 | Huang | F04D 29/281 |
| 2020/0182258 | A1 * | 6/2020 | Lin | F04D 25/0613 |
| 2020/0191157 | A1 * | 6/2020 | Lin | F04D 29/282 |

FOREIGN PATENT DOCUMENTS

| | | | |
|---|---|---|---|
| CN | 101078354 | | 3/2013 |
| CN | 106917764 A | * | 7/2017 |
| CN | 109751280 A | * | 5/2019 |
| CN | 113048096 A | * | 6/2021 |
| CN | 215409322 U | * | 1/2022 |
| TW | 201634819 | | 10/2016 |

OTHER PUBLICATIONS

He (CN 106917764) English Translation (Year: 2017).*

* cited by examiner

*Primary Examiner* — Brian Christopher Delrue
(74) *Attorney, Agent, or Firm* — JCIPRNET

(57) ABSTRACT

A fan adapted for being disposed in an electronic device is provided. The fan includes a hub and a plurality of metal blades respectively extending from the hub. Each of the metal blades has a root portion connected to the hub and an end portion away from the hub, and a mass of the end portion is greater than a mass of the root portion, such that the metal blade is elongated while the fan is rotated.

13 Claims, 4 Drawing Sheets

FAN

CROSS-REFERENCE TO RELATED APPLICATION

This application claims the priority benefit of Taiwanese application no. 110108972, filed on Mar. 12, 2021. The entirety of the above-mentioned patent application is hereby incorporated by reference herein and made a part of this specification.

BACKGROUND

Technical Field

The disclosure relates to a kind of fan.

Description of Related Art

In response to the trend toward thinness of consumer electronic products, electronic products such as computers and handheld devices are all developing toward the direction of lightness/thinness and high performance. However, lightness/thinness and high performance often conflict with each other. During operation high-efficiency elements generate a large amount of waste heat inside the electronic products. For this reason, a heat dissipation module is required to be disposed for heat dissipation and cooling of the elements. However, subject to the thinned volume of the electronic products, it is difficult for the heat dissipation efficiency of the existing heat dissipation module to meet the requirements.

Taking a fan required by the heat dissipation module as an example, when being rotated, it is inevitable that blades thereof, together with surrounding structures such as a housing that accommodates the fan, generate airflow noise (blade tone). Particularly, due to generation of vortex at the end/edge of the blade, high wind resistance, low flow rate, high noise, or the like are often caused.

On the other hand, subject to the space of the light-weighted/thinned electronic products, the volume of the fan required by the heat dissipation module cannot be increased indefinitely. Therefore, under the condition of limited volume, how to further improve the properties such as the flow rate generated by the fan to meet the heat dissipation requirements is an issue for those skilled in the art to work on.

SUMMARY

The disclosure provides a fan, of which a metal blade is elongated when being rotated due to a mass difference thereof, thereby improving performance of the fan and reducing noise and resistance.

According to an embodiment of the disclosure, a fan is adapted for being disposed in an electronic device. The fan includes a hub and a plurality of metal blades respectively extending from the hub. Each of the metal blades has a root portion connected to the hub and an end portion away from the hub, and a mass of the end portion is greater than a mass of the root portion, such that the blade is elongated while the fan is rotated.

Based on the foregoing, the mass of the metal blade of the fan is appropriately changed. That is, in the structure where the metal blade extends from the root portion (connected to the hub) to the end portion (away from the hub), the mass in the end portion is greater than the mass in the root portion. Therefore, when the fan is rotated, the end portion with the larger mass causes the metal blade to be elongated due to centrifugal force, resulting in a larger wind-capturing area, namely increasing the flow rate of the airflow passing the fan. Moreover, the heat dissipation performance of the fan is thus improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
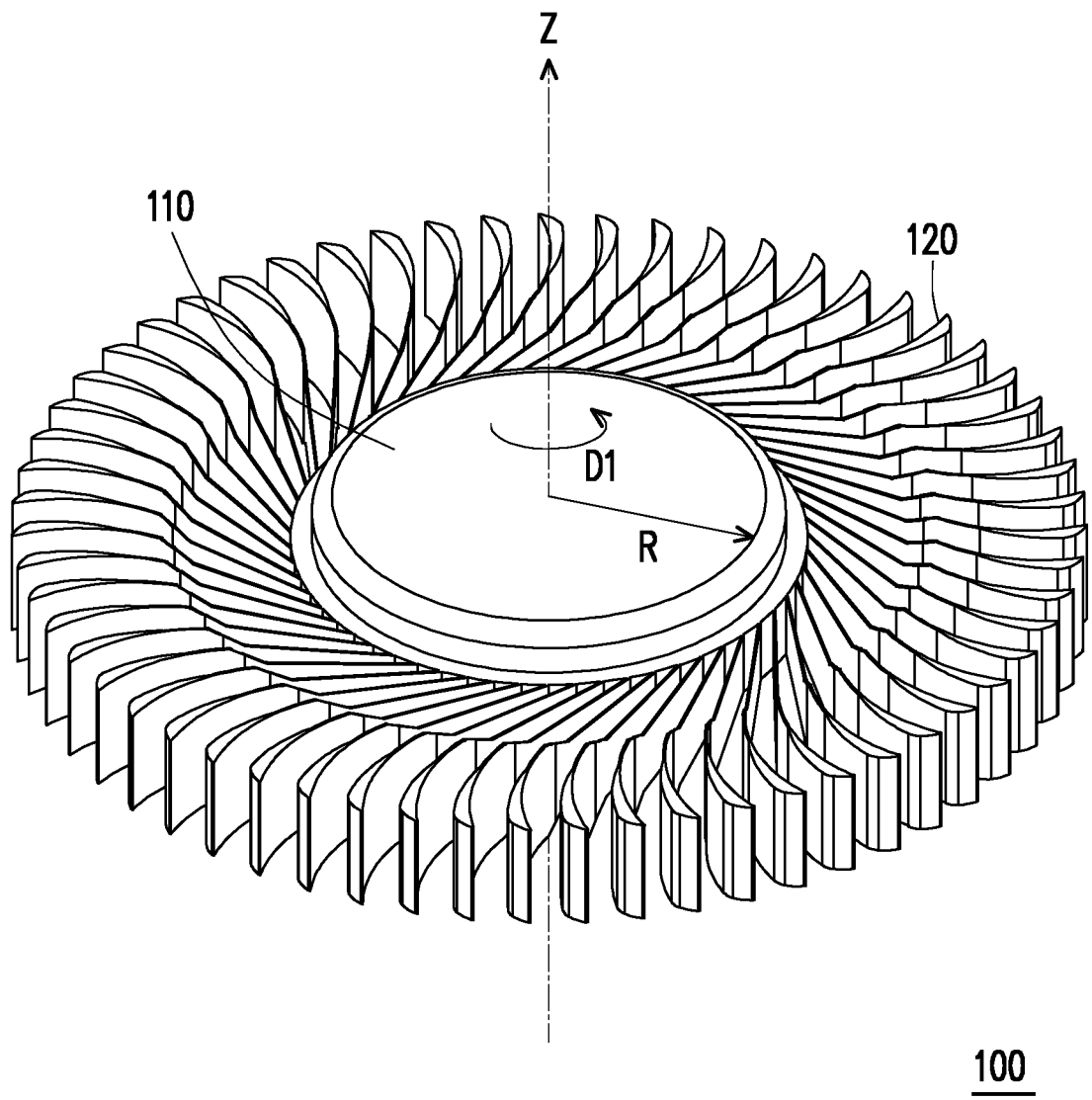
FIG. 1 is a schematic diagram of a fan according to an embodiment of the disclosure.
Figure 2:
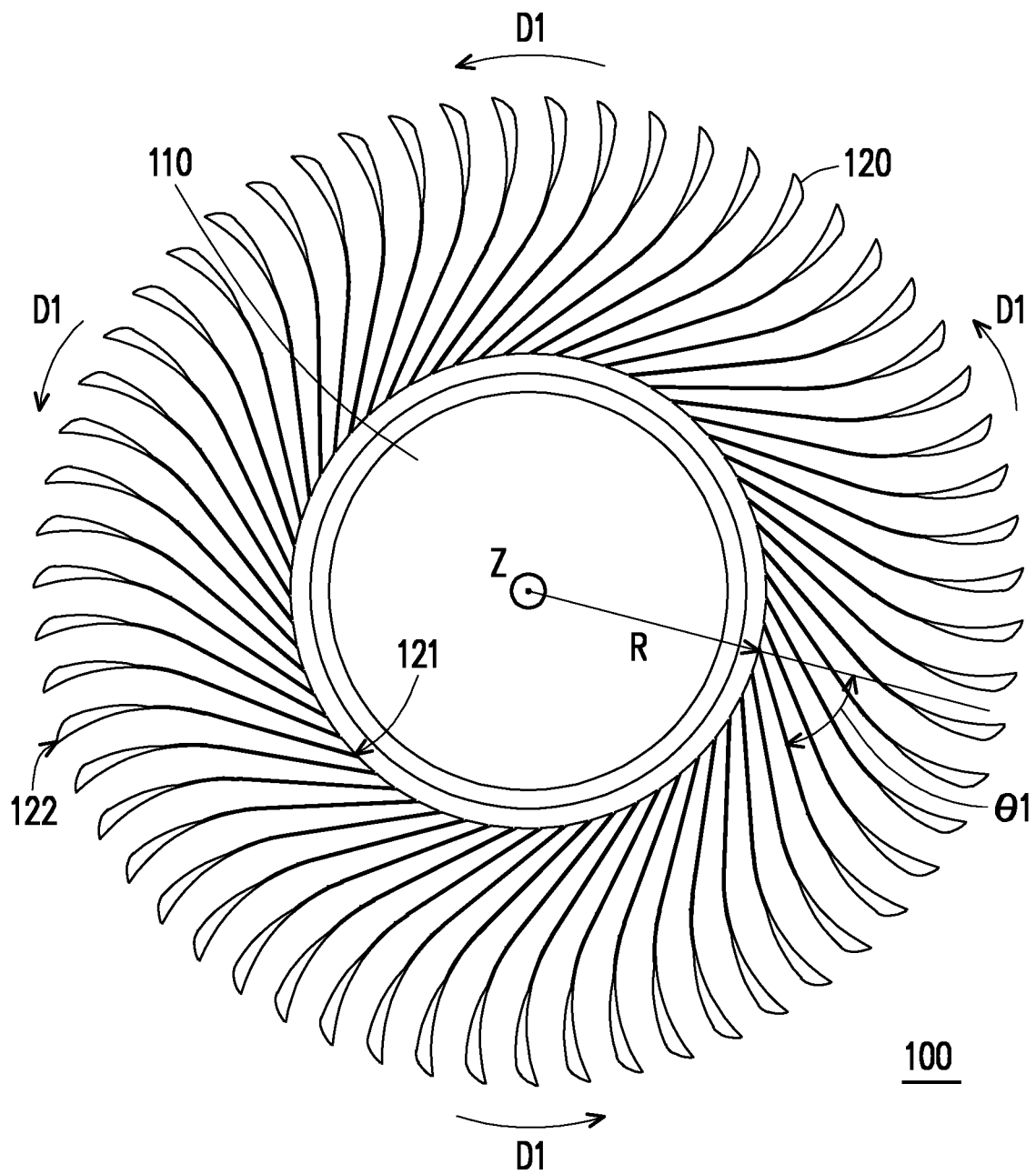
FIG. 2 is a top view of the fan of FIG. 1.

FIG. 1 is a schematic diagram of a fan according to an embodiment of the disclosure. FIG. 2 is a top view of the fan of FIG. 1. With reference to FIG. 1 and FIG. 2 together, in this embodiment, a heat dissipation fan 100 is adapted for being disposed in an electronic device (e.g., a notebook computer) to effectively perform heat dissipation on a heat source of the electronic device. Since the type of the electronic device is not limited, illustration of the electronic device is omitted herein. Herein, the fan 100 includes a hub 110 and a plurality of metal blades 120. In addition, an axial direction Z of the hub 110, one of the radial directions R, and a rotation direction D1 of the fan 100 are provided as examples in the drawings. Herein, the hub 110 and the metal blades 120 is rotated along the axial direction Z.

Each of the metal blades 120 of this embodiment extends from the hub 110 and is inclined relative to the radial direction R of the hub 110. As shown in FIG. 2, the metal blade 120 includes an acute angle θ1 relative to the radial direction R. That is, the metal blade 120 is in a swept-forward state relative to the rotation direction D1 of the fan 100. In this embodiment, each of the metal blades 120 has a root portion 121 connected to the hub 110 and an end portion 122 away from the hub 110, and in each of the metal blades 120, a mass of the end portion 122 is greater than a mass of the root portion 121. Therefore, when the fan 100 is rotated along the rotation direction D1, the end portion 122 with a larger mass will cause the metal blade 120 to be elongated under the influence of centrifugal force.

Figure 3A:
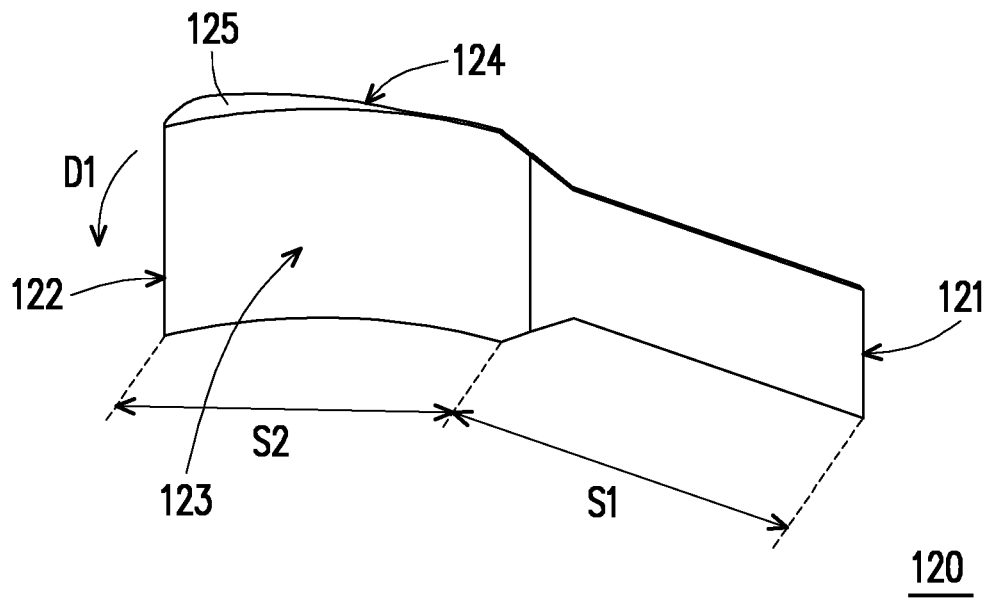
FIG. 3A and FIG. 3B show the metal blade from different perspectives.
Figure 3B:
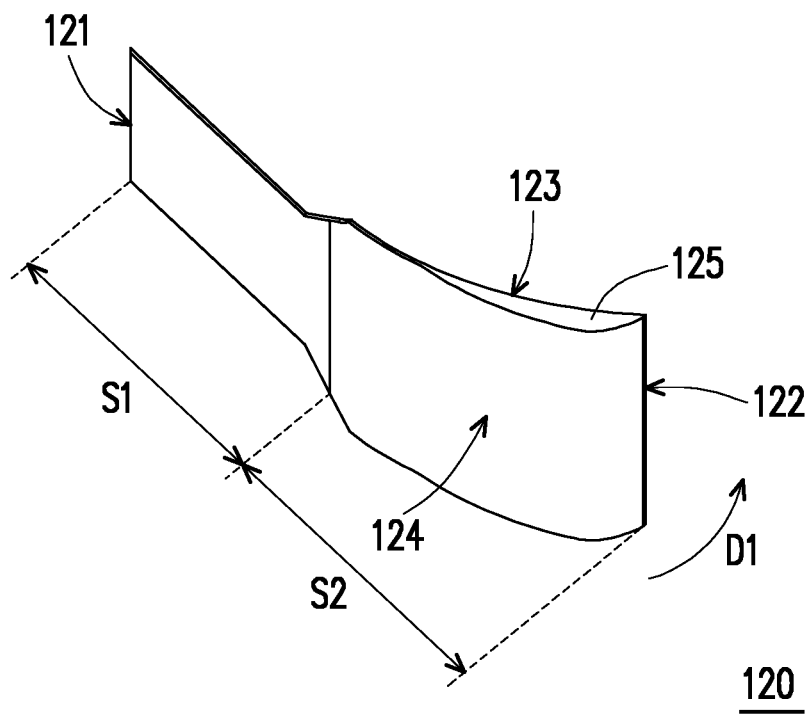

FIG. 3A and FIG. 3B show the metal blade from different perspectives. With reference to FIG. 3A and FIG. 3B together, in this embodiment, when the fan 100 is rotated, the metal blade 120 has a windward surface 123 and a leeward surface 124. As shown in the figures, the windward surface 123 is a concave surface, and the leeward surface 124 is a convex surface. Moreover, the metal blade 120 of this embodiment also has a weighting portion 125 located on the leeward surface 124, and the weighting portion 125 is substantially connected to the end portion 122. In other words, in the metal blade 120 of this embodiment, through the weighting portion 125 disposed on the end portion 122, in the metal blade 120, the mass of the end portion 122 is greater than the mass of the root portion 121. Accordingly, the metal blade 120 is elongated under the influence of centrifugal force when the fan 100 is rotated as mentioned above.

Furthermore, in this embodiment, a profile of the metal blade 120 from the root portion 121 to the end portion 122 is divided into a first segment S1 and a second segment S2. The root portion 121 is located at the connecting place between the first segment S1 and the hub 110, and the end portion 122 is located at the end of the second segment S2. In addition, an area in the second segment S2 of the metal blade 120 is larger than an area in the first segment S1 of the metal blade 120. That is to say, before the metal blade 120 reaches the weighting portion 125, its mass is first increased by using the second segment S2 with a larger area. Herein, the metal blade 120 has a thickness in the first segment S1 substantially the same as in a portion of the second segment S2 where the weighting portion 125 is not present. Compared with the first segment S1, the second segment S2 first utilizes a blade profile with a larger area, and then the second segment S2 is further thickened by disposing the weighting portion 125 on the second segment S2. That is, a thickness in the second segment S2 of the metal blade 120 is greater than a thickness in the first segment S1 of the metal blade 120 to increase the mass of the metal blade 120 in the end portion 122.

Figure 4:
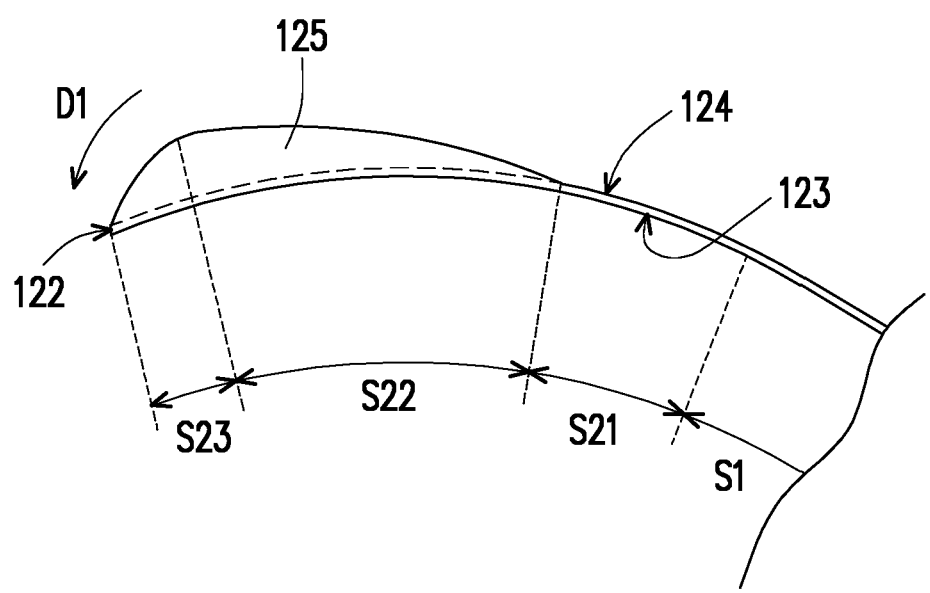
FIG. 4 shows a partial top view of the metal blade.

FIG. 4 shows a partial top view of the metal blade. With reference to FIG. 3A, FIG. 3B, and FIG. 4 together, in this embodiment, a profile of the weighting portion 125 located on the leeward surface 124 is streamlined. Furthermore, the second segment S2 is divided into a first sub-segment S21, a second sub-segment S22, and a third sub-segment S23. The first sub-segment S21 is connected to the first segment S1, the second sub-segment S22 is connected between the first sub-segment S21 and the third sub-segment S23, the end portion 122 is located in the third sub-segment S23, and the weighting portion 125 is located in the second sub-segment S22 and the third sub-segment S23. In other words, the weighting portion 125 of this embodiment is utilized to increase the thickness in the second sub-segment S22 and the third sub-segment S23 of the metal blade 120. Furthermore, the thickness of the metal blade 120 from the second sub-segment S22 to the third sub-segment S23 is gradually increased and then gradually decreased. On the whole, the thickness of the metal blade 120 from the root portion 121 to the end portion 122 is sequentially presented as an equal thickness, a gradually increased thickness, and a gradually decreased thickness.

With reference to FIG. 4 again, where a dashed line extending from the first segment S1 is provided, which represents a portion of the metal blade 120 with the same thickness as the first segment S1. It is clearly shown from FIG. 4 that the weighting portion 125 is located in the second sub-segment S22 and the third sub-segment S23 and on the leeward surface 124. It can accordingly be known that the presence of the weighting portion 125 effectively reduces the flow resistance of the metal blade 120 when the fan 100 is rotated. Furthermore, when the fan 100 is rotated, in the metal blade 120 inclined relative to the hub 110, a high angle of attack is present in the end portion 122 due to a large curvature, then forming boundary layer separation, i.e., flow separation of the high-speed fluid that flows through the bend. As a result, backflow is generated in the fluid near the bend due to a viscous force, which then causes resistance to the metal blade 120 and meanwhile also generates noise. Accordingly, in the metal blade 120 of this embodiment, the excessively large profile curvature of the end portion 122 is offset, i.e., the angle of attack is reduced, by the presence of the weighting portion 125. At the same time, since the weighting portion 125 is streamlined, the time of generation of the flow separation can be delayed, and the noise and flow resistance caused in the end portion 122 can accordingly be reduced, thereby improving the heat dissipation performance of the fan 100.

Herein, in each of the metal blades 120, a plurality of segments with different curvatures are present along the path where the metal blades 120 extend away from the hub 110. In addition, for each of the metal blades 120, a flat-plate-shaped workpiece of equal thickness is first formed by stamping and then is bent to form the segments. Next, a process of combination of heterogeneous materials may be adopted, and the weighting portion 125 is disposed in the second sub-segment S22 and the third sub-segment S23 and is made to be streamlined, increasing the mass of the metal blade 120 in the end portion 122 in the meanwhile. After that, these metal blades 120 are combined one after another with the hub 110 by injection molding or die-casting. In other words, in this embodiment, since the metal blade 120 has the properties of being easily formed and easily processed, for the required fan properties, simple corresponding processing manners may be easily proposed. That is to say, the metal portion of the metal blade 120 is formed into a member of equal thickness as mentioned above, and then the required weighting portion 125 is formed on the member of equal thickness with other non-metallic materials and corresponding processing manners such as over-molding process or embedded injection process with plastics.

In summary of the foregoing, in the embodiments of the disclosure, the mass of the metal blade of the fan is appropriately changed. That is, in the structure where the metal blade extends from the root portion (connected to the hub) to the end portion (away from the hub), the mass in the end portion is greater than the mass in the root portion. Therefore, when the fan is rotated, the end portion with the larger mass causes the metal blade to be elongated due to centrifugal force, resulting in a larger wind-capturing area, namely increasing the flow rate of the airflow passing the fan. Moreover, in the metal blade, the excessively large profile curvature of the end portion is offset, i.e., the angle of attack is reduced, by the presence of the weighting portion. At the same time, since the weighting portion is streamlined, the time of generation of the flow separation can be delayed, and the noise and flow resistance caused in the end portion can accordingly be reduced, thereby improving the heat dissipation performance of the fan.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A fan, adapted for being disposed in an electronic device, wherein the fan comprises:
   a hub; and
   a plurality of metal blades respectively extending from the hub, wherein each of the metal blades has a root portion connected to the hub and an end portion away from the hub, and in each of the metal blades, a mass of the end portion is greater than a mass of the root portion, such that the metal blade is elongated while the fan is rotated, wherein the metal blade has a weighting portion and has a windward surface and a leeward surface opposite to each other, and the weighting portion is located on the leeward surface and connected to the end portion.

2. The fan according to claim 1, wherein the windward surface is presented as a concave surface, and the leeward surface is presented as a convex surface.

3. The fan according to claim 1, wherein a profile of the metal blade from the root portion to the end portion is divided into a first segment and a second segment, the root portion is located in the first segment, the end portion is located in the second segment, and an area in the second segment of the metal blade is greater than an area in the first segment of the metal blade.

4. The fan according to claim 1, wherein a profile of the metal blade from the root portion to the end portion is divided into a first segment and a second segment, the root portion is located in the first segment, the end portion is located in the second segment, and the metal blade has a weighting portion located in the second segment.

5. The fan according to claim 4, wherein a thickness in the second segment of the metal blade where the weighting portion is disposed is greater than a thickness in the first segment of the metal blade.

6. The fan according to claim 4, wherein the second segment is divided into a first sub-segment, a second sub-segment, and a third sub-segment, the first sub-segment is connected to the first segment, the second sub-segment is connected between the first sub-segment and the third sub-segment, the end portion is located in the third sub-segment, and the weighting portion is located in the second sub-segment and the third sub-segment.

7. The fan according to claim 6, wherein the weighting portion increases a thickness in the second sub-segment and the third sub-segment of the metal blade.

8. The fan according to claim 7, wherein the thickness of the metal blade from the second sub-segment to the third sub-segment is gradually increased and then gradually decreased.

9. The fan according to claim 1, wherein a thickness of the metal blade from the root portion to the end portion is sequentially presented as an equal thickness, a gradually increased thickness, and a gradually decreased thickness.

10. The fan according to claim 1, wherein each of the metal blades is inclined relative to a radial direction of the hub.

11. The fan according to claim 1, wherein the fan is a centrifugal fan.

12. The fan according to claim 1, wherein the metal blade is formed with a combination of a metal material and a non-metal material, and the weighting portion is the non-metal material.

13. The fan according to claim 12, wherein the metal material is presented as a member of equal thickness, and the weighting portion is injection-molded on the member of equal thickness by using plastic injection.

* * * * *